(12) United States Patent
Moriwaki

(10) Patent No.: US 7,889,816 B2
(45) Date of Patent: Feb. 15, 2011

(54) CLOCK AND DATA RECOVERY CIRCUIT AND COMMUNICATIONS APPARATUS INCLUDING THE CLOCK AND DATA RECOVERY CIRCUIT

(75) Inventor: Isamu Moriwaki, Toyonaka (JP)

(73) Assignee: Ricoh Company, Ltd., Tokyo (JP)

( * ) Notice: Subject to any disclaimer, the term of this patent is extended or adjusted under 35 U.S.C. 154(b) by 526 days.

(21) Appl. No.: 12/048,020

(22) Filed: Mar. 13, 2008

(65) Prior Publication Data

US 2008/0226009 A1 Sep. 18, 2008

(30) Foreign Application Priority Data

Mar. 16, 2007 (JP) ............... 2007-068516

(51) Int. Cl.
*H04L 27/00* (2006.01)
*H04L 7/00* (2006.01)
*H03D 3/18* (2006.01)

(52) U.S. Cl. ............... 375/326; 375/327; 375/355

(58) Field of Classification Search ............... 375/326, 375/327, 355
See application file for complete search history.

(56) References Cited

U.S. PATENT DOCUMENTS

2003/0095619 A1* 5/2003 Vallet et al. ............... 375/355
2005/0135527 A1* 6/2005 Masui et al. ............... 375/355
2005/0238093 A1* 10/2005 Payne et al. ............... 375/224

FOREIGN PATENT DOCUMENTS

| JP | 2002-190724 | 7/2002 |
|----|-------------|--------|
| JP | 2003-224551 | 8/2003 |
| JP | 2004-128980 | 4/2004 |
| JP | 2006-262165 | 9/2006 |
| JP | 2007-189601 | 7/2007 |

* cited by examiner

*Primary Examiner*—Don N Vo
(74) *Attorney, Agent, or Firm*—Dickstein Shapiro LLP

(57) ABSTRACT

A clock and data recovery circuit that includes a unit to output N-phase clocks each of which has a phase shifted from the others by a time T2 obtained by dividing a clock period P1 by N, a unit to obtain sampling data serially transferred every time T2, a unit to convert the sampling data into first N-bit parallel data every period P1, a unit to convert the first N-bit parallel data into second N-bit parallel data indicating a change point in the sampling data, and a unit to use the second N-bit parallel data as input of phase information and output third N-bit parallel data indicating substantially a center position of the change point. N is an integer greater than 2 and data of the first N-bit parallel data at a position equal to the position indicated by the third N-bit parallel data is determined to be recovered data.

11 Claims, 12 Drawing Sheets

FIG. 4A
| 0000 | --- |
| 0001 | —| |
| 0010 | -|- |
| 0100 | -|— |
| 1000 | |— |
| 1001 | |—| |
FIG. 4B
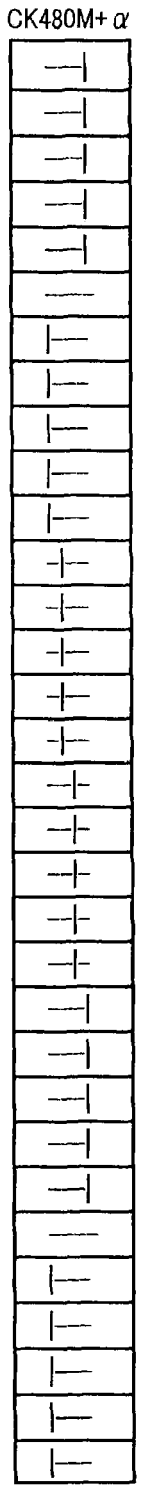
CK480M+α
FIG. 4C
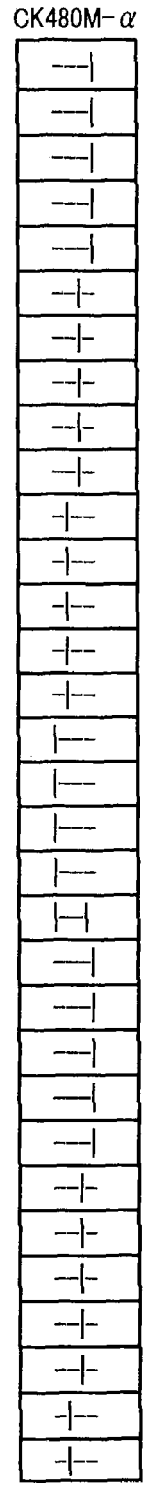
CK480M−α

FIG. 5A       FIG. 5B       FIG. 5C
| 00000000 |
| 00000001 |
| 00000010 |
| 00000100 |
| 00001000 |
| 00010000 |
| 00100000 |
| 01000000 |
| 10000000 |
| 10000001 |
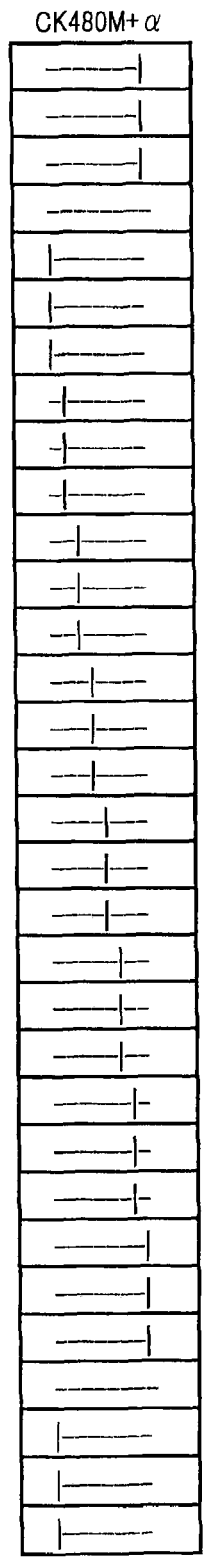
CK480M+α
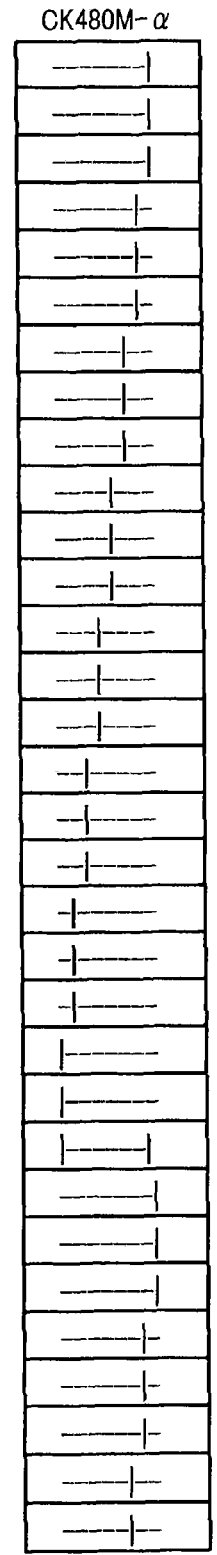
CK480M−α

| out_parack | en1 | en2 | sdo1 | sdo2 |
|---|---|---|---|---|
| 0000 | 0 | 0 | × | × |
| 0001 | 1 | 0 | paradat[0] | × |
| 0010 | 1 | 0 | paradat[1] | × |
| 0100 | 1 | 0 | paradat[2] | × |
| 1000 | 1 | 0 | paradat[3] | × |
| 1001 | 1 | 1 | paradat[0] | paradat[3] |

FIG. 13B

| out_parack | en1 | en2 | sdo1 | sdo2 |
|---|---|---|---|---|
| 00000000 | 0 | 0 | × | × |
| 00000001 | 1 | 0 | paradat[0] | × |
| 00000010 | 1 | 0 | paradat[1] | × |
| 00000100 | 1 | 0 | paradat[2] | × |
| 00001000 | 1 | 0 | paradat[3] | × |
| 00010000 | 1 | 0 | paradat[4] | × |
| 00100000 | 1 | 0 | paradat[5] | × |
| 01000000 | 1 | 0 | paradat[6] | × |
| 10000000 | 1 | 0 | paradat[7] | × |
| 10000001 | 1 | 1 | paradat[0] | paradat[7] |

CLOCK AND DATA RECOVERY CIRCUIT AND COMMUNICATIONS APPARATUS INCLUDING THE CLOCK AND DATA RECOVERY CIRCUIT

CROSS-REFERENCE TO RELATED APPLICATION

This patent specification is based on and claims priority from Japanese Patent Application No. 2007-068516, filed on Mar. 16, 2007 in the Japan Patent Office, the entire contents of which are hereby incorporated by reference herein.

BACKGROUND

1. Field of the Invention

The present invention relates to a clock and data recovery circuit and a communications apparatus including the clock and data recovery circuit.

2. Description of the Related Art

Universal Serial Bus (USB) is a standard for connecting a personal computer to a peripheral device. USB 2.0 is a high-speed USB standard for serial communications with a maximum transfer rate of 480 Mbps. With its great improvement in transfer rate and reduced system load, the USB 2.0 has come into widespread use.

In serial communications, data is transmitted and received over a pair of data lines D+ and D− using small-amplitude differential signals without a clock. Generally, a receiver extracts a clock from the received data, which is then sampled with the extracted clock to obtain the data. A circuit that extracts a clock and data from received data is referred to as a clock and data recovery circuit, generally referred to as a CDR circuit.

The CDR circuit used in a high-speed serial interface is a technology to regenerate a clock based on a transition in received data. The CDR circuit generally uses an analog PLL (Phase Locked Loop) to extract a clock synchronous to an edge of the received data and sample the received data with the clock.

Since digital circuit blocks are integrated onto a LSI (Large Scale Integrated) circuit using a fine fabrication process, high-speed operation becomes possible even for a rapid increase in serial transfer rate such as that of USB 2.0. However, it is not easy to apply the fine fabrication process to an analog circuit block with a size similar to that of the digital circuit block. Consequently, if the LSI circuit includes a conventional analog PLL, the cost of the circuit is relatively high.

For connection between circuit boards or between LSI circuits in an apparatus, high-speed serial interfaces such as PCI Express have been recently used. However, an increase in the number of channels results in not only cost penalties bus also noise interference when each channel is provided with an analog PLL.

There is a high-speed serial interface circuit that uses a digital PLL instead of an analog PLL. However, the digital PLL needs an operation clock with a frequency of at least three times greater than a frequency of the extracted clock. Accordingly, it is difficult to employ the digital PLL in recent high-speed serial communication systems in view of resulting increases in cost and power consumption.

Whether analog or digital, the PLL samples received data with an extracted clock to regenerate data. Since the clock extracted by the PLL is asynchronous to the clock at the receiver, the synchronous design technique mostly used in digital LSI design is unavailable, thus increasing development time including design verification.

There are a number of CDR circuits that regenerate a clock and data without using an analog circuit. However, such a CDR circuit needs a large circuit block that samples data with multi-phase clocks. Since the multi-phase clocks with different delays need to be input (re-synchronized) together, both layout and simulation required to study the behavior of the circuit are difficult to achieve even with digital circuits. In particular, the difficulty increases dramatically with higher speed operation.

In a serial transfer operation, the frequency of a serial clock at a transmission side cannot be equal to the frequency of a serial clock at a receiving side. To absorb the frequency difference therebetween, a buffer (generally referred to as an elastic buffer) is needed. The elastic buffer includes a FIFO (First In First Out) register in which data is written synchronously to the clock extracted from received data (i.e., the serial clock at the transmission side) and data is read synchronously to the serial clock at the receiving side. Since the writing and the reading operations are not synchronous, the timing of these operations needs to be controlled by an asynchronous circuit, which complicates both the circuitry and the simulations required to study the behavior of the circuit. This problem may be solved by an elastic buffer that operates cooperatively with the CDR circuit with one type of clock. However, such an elastic buffer has not yet been disclosed.

To solve the problems described above, another approach has been proposed in which the data is sampled with multi-phase clocks and a clock pattern is determined based on the pattern of the sampling data. However, it is difficult to qualitatively determine each parameter in the CDR circuit. Therefore, it may be preferable that, in addition to regenerating a clock based on a transition in received data, the CDR circuit set a period of time to respond to the transition (a loop gain of a PLL) and a phase difference between the received data and the clock (a steady-state error of a PLL) as parameters. However, such setting is difficult to achieve with conventional techniques.

SUMMARY

This patent specification describes a novel clock and data recovery circuit that includes a clock output unit to output N-phase clocks each of which has a phase shifted from the others by a time T2 obtained by dividing a period P1 of a reference clock at a receiver at a given frequency by N, where N is an integer equal to or greater than 3; a sampling unit to obtain sampling data serially transferred at every time T2; a first conversion unit to convert the sampling data into first N-bit parallel data every period P1; a second conversion unit to convert the first N-bit parallel data into second N-bit parallel data indicating a change point in the sampling data; and a data output unit to use the second N-bit parallel data as input of phase information and output third N-bit parallel data indicating substantially a center position of the change point in the sampling data. Data of the first N-bit parallel data at a position equal to substantially the center position indicated by the third N-bit parallel data is determined to be recovered data.

This patent specification further describes a novel communications apparatus that includes the clock and data recovery circuit described above.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 4A is a table illustrating six possible patterns of a signal parack when four-phase clocks are used;

FIG. 4B is a diagram illustrating an example how the six patterns appear when a reference clock at a transmitter is faster than a reference clock at a receiver;

FIG. 4C is a diagram illustrating an example how the six patterns appear when the reference clock at the transmitter is slower than the reference clock at the receiver;

FIG. 5A is a table illustrating ten possible patterns of the signal parack when eight-phase clocks are used;

FIG. 5B is a diagram illustrating an example how the ten patterns appear when the reference clock at the transmitter is faster than the reference clock at the receiver;

FIG. 5C is a diagram illustrating an example how the ten patterns appear when the reference clock at the transmitter is slower than the reference clock at the receiver;

FIG. 9 is a diagram illustrating an example operation of the digital PLL of FIGS. 6 through 8 with values of each signal;

FIG. 13A is an example truth table of an SDOSEL circuit 30 of FIG. 12 when four-phase clocks are used;

FIG. 13B is an example truth table of the SDOSEL circuit 30 of FIG. 12 when eight-phase clocks are used;

DETAILED DESCRIPTION OF EXEMPLARY EMBODIMENTS

Figure 1:
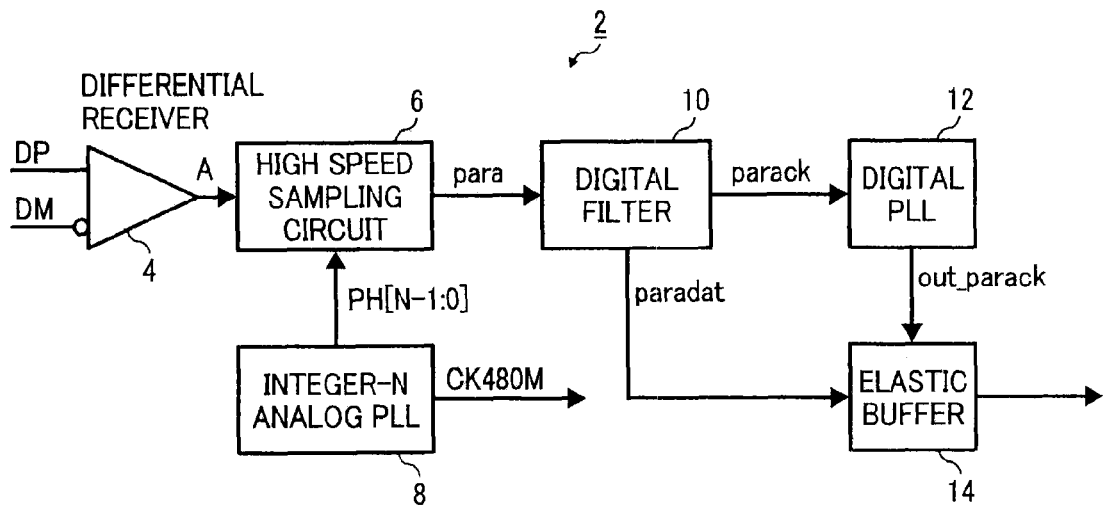
FIG. 1 is a block diagram illustrating example circuitry of a CDR circuit according to a first embodiment of the present invention.

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals and reference characters designate identical or corresponding parts throughout the several views thereof, and in the first instance to FIG. 1, clock and data recovery circuits according to exemplary embodiments of the present invention are described.

FIG. 1 is a block diagram illustrating example circuitry of a CDR circuit 2 according to a first embodiment. A differential receiver 4 illustrated in FIG. 1 outputs a signal A of either 0 or 1 according to a potential difference between input signals DP and DM input to the differential receiver 4. An integer-N analog PLL 8 (N being an integer equal to or greater than 3) illustrated in FIG. 1 is an ordinary PLL that generates a clock CK480M (a clock of 480 MHz for USB 2.0) with a clock period P1, which is a reference clock at a receiver, and N-phase clocks PH[N−1:0] each of which has a phase shifted from the others by a time T2 obtained by dividing the clock period P1 by an integer N.

A high-speed sampling circuit 6 illustrated in FIG. 1 is a circuit block that obtain sampling data serially transferred with multi-phase clocks, i.e., the N-phase clocks, and converts the sampling data into N-bit parallel data para. A digital filter 10 illustrated in FIG. 1 is a circuit block that generates a signal paradat by equalizing the N-bit parallel data and a signal parack indicating an edge of the signal paradat. A digital PLL 12 illustrated in FIG. 1 is a circuit block that generates a signal out_parack indicating a change point in received data, i.e., substantially a center position of the edge indicated by the signal parack. The signal paradat, the signal parack, and the signal out_parack are all N-bit parallel data signals. An elastic buffer 14 illustrated in FIG. 1 is a circuit block including a circuit (generally referred to as a data punching circuit) that regenerates the received data using the signal paradat and the signal out_parack and a buffer that absorbs a frequency difference between the clock extracted from the received data (i.e., a reference clock at a transmitter) and the reference clock at the receiver. The data of the signal paradat at a position equal to substantially the center position indicated by the signal out_parack is determined to be recovered data.

Figure 2:
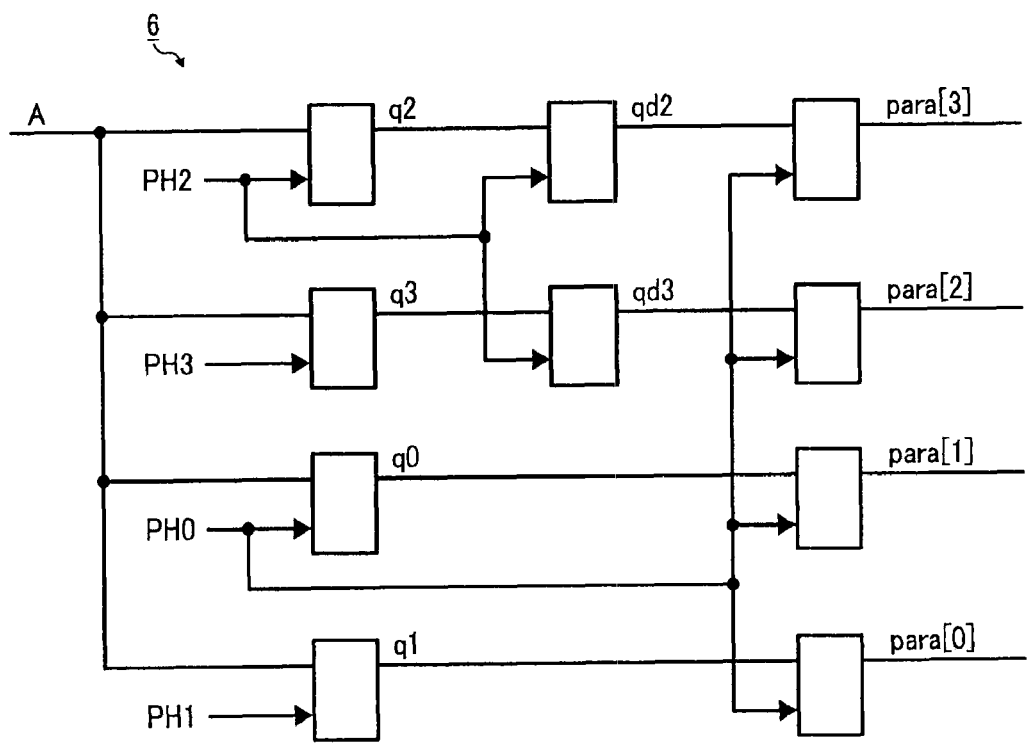
FIG. 2 is a diagram illustrating example circuitry of a high-speed sampling circuit when four-phase clocks are used.

FIG. 2 is a diagram illustrating example circuitry of the high-speed sampling circuit 6 when four-phase clocks PH0, PH1, PH2, and PH3 are used. In FIG. 2, signals output in the high-speed sampling circuit 6 are indicated as q0, q1, q2, q3, qd2, and qd3, respectively, and the output signals of the high-speed sampling circuit 6 are illustrated as para[0], para[1], para[2], and para[3].

Figure 3:
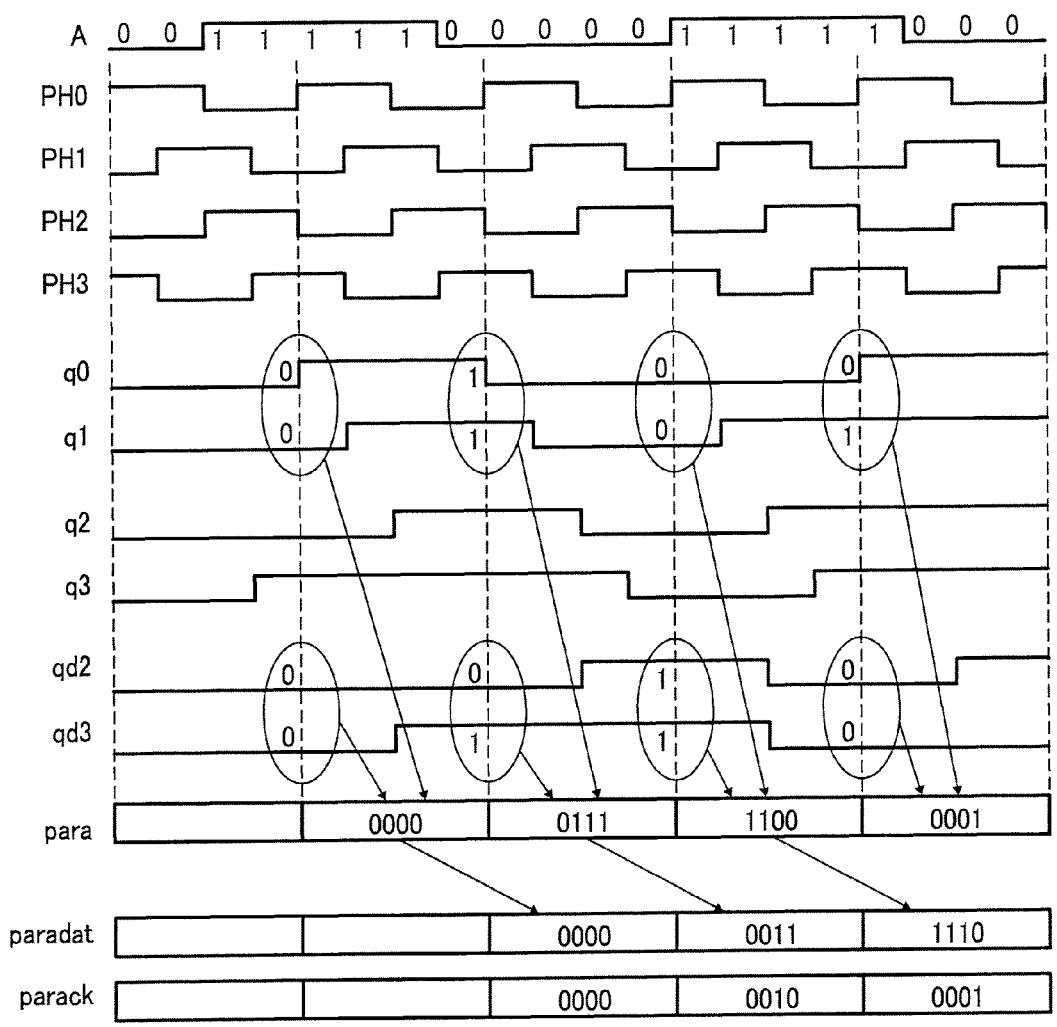
FIG. 3 is a timing chart illustrating an example operation of the high-speed sampling circuit of FIG. 2.

FIG. 3 is a timing chart illustrating an example operation of the high-speed sampling circuit 6 of FIG. 2. The signal paradat and the signal parack output from the digital filter 10 are illustrated in FIG. 3. The signal paradat illustrated in FIG. 3 is obtained by filtering the signal para with a three-valued moving-average filter.

Although the configuration of the digital filter 10 is not limited to the present embodiment, a simple LPF (Low-Pass Filter) such as a moving-average filter for deglitching input data suffices as the digital filter 10, since the digital PLL 12 in the following stage has characteristics equivalent to those of a steep BPF (Band-Pass filter). The signal parack output from the digital filter 10 is a signal that changes to 1 at an edge of the signal paradat, i.e., at a bit changing from 0 to 1 or from 1 to 0, and therefore easily generated by an EXOR (Exclusive OR) circuit.

FIG. 4A is a table illustrating six possible patterns of the signal parack when four-phase clocks are used. The six patterns of the signal parack include a pattern with no edge in the clock period, patterns with an edge at a position corresponding to each multi-phase clock, and a pattern with two edges in the clock period. FIG. 4B is a diagram illustrating an example how the six patterns appear when the reference clock at the transmitter is faster than the reference clock at the receiver (CK480M+α). FIG. 4C is a diagram illustrating an example how the six patterns appear when the reference clock at the transmitter is slower than the reference clock at the receiver (CK480M−α).

Similarly, FIG. 5A is a table illustrating ten possible patterns of the signal parack when eight-phase clocks are used, FIG. 5B is a diagram illustrating an example how the ten patterns appear when the reference clock at the transmitter is faster than the reference clock at the receiver (CK480M+α), and FIG. 5C is a diagram illustrating an example how the ten patterns appear when the reference clock at the transmitter is slower than the reference clock at the receiver (CK480M−α). As illustrated in FIGS. 4A and 5A, when N-phase clocks are used, the phase of the reference clock at the transmitter is virtually expressed in N+2 ways. A signal of a pattern other than the N+2 patterns, which may be generated by a sudden noise, is removed by the digital filter 10.

Figure 6:
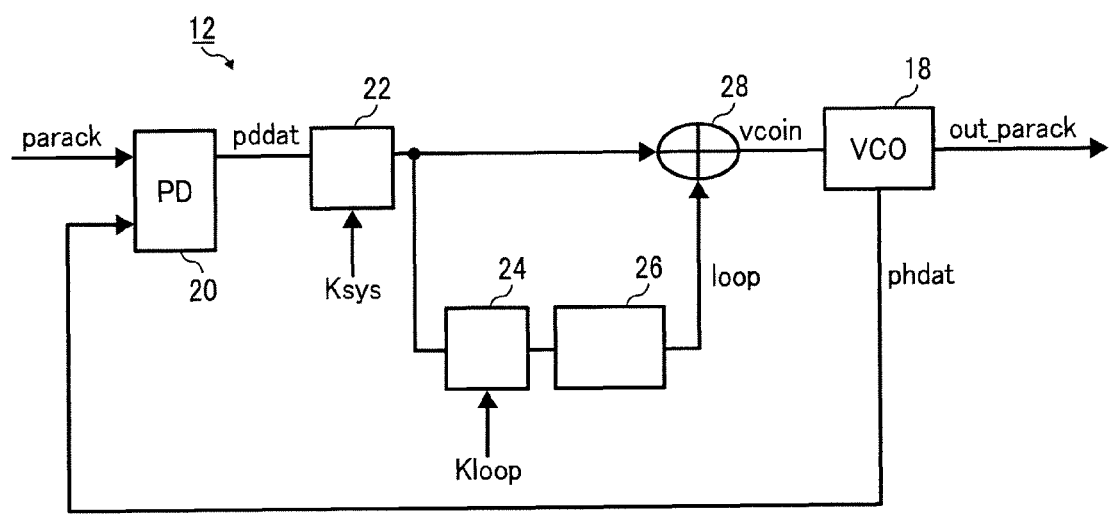
FIG. 6 is a block diagram illustrating an example configuration of a digital PLL according to the first embodiment of the present invention.
Figure 7:
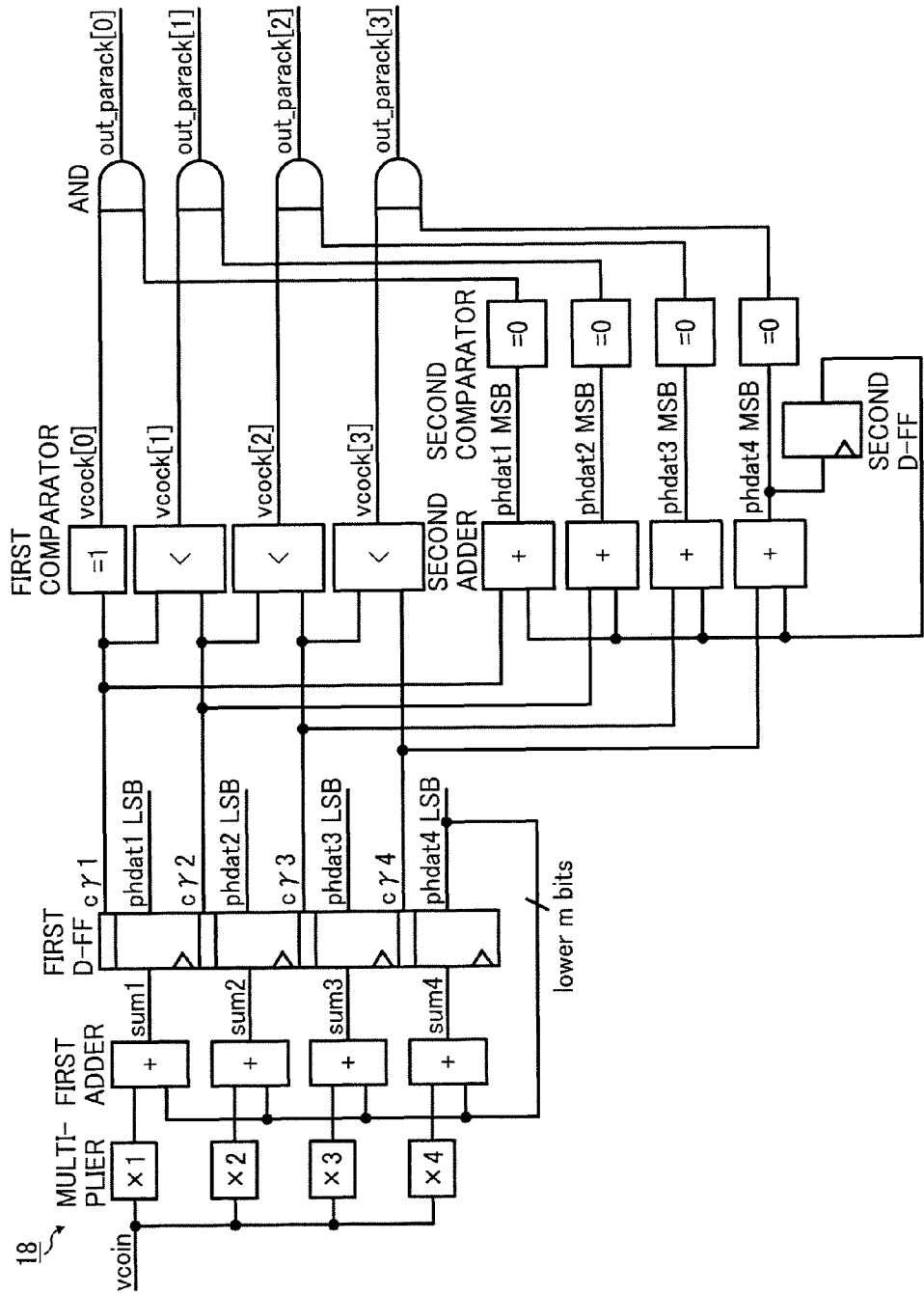
FIG. 7 is a diagram illustrating example circuitry of a voltage-controlled oscillator when four-phase clocks are used.

FIG. 6 is a block diagram illustrating an example configuration of the digital PLL 12 according to the first embodiment. Although the configuration of the digital PLL 12 illustrated in FIG. 6 may appear to be the same as the configuration of a conventional PLL, a feature of the digital PLL 12 is that the input signal parack, the output signal out_parack, and a signal phdat that indicates phase information are N-bit parallel data signals. FIG. 7 is a diagram illustrating example circuitry of a VCO (Voltage-Controlled Oscillator) circuit 18 when four-phase clocks are used.

The digital PLL 12 illustrated in FIG. 6 includes the VCO circuit 18, a PD (Phase Detector) 20, and a loop filter block that controls PLL feedback.

As illustrated in FIG. 7, the VCO circuit 18 includes N multipliers that multiply input data vcoin by 1 through N (N=4 in FIG. 7), respectively, N first adders that add N outputs of the multipliers to first feedback data, and N first D-FFs serving as memories that store N first sums output from the first adders every period P1 of the reference clock. The first sums are illustrated as sum1 through sum4 in FIG. 7. As illustrated in FIG. 7, among the first D-FF outputs of cγ1 through cγ4 and phdat1 LSB (Least Significant Bit) through phdat4 LSB, lower m bits (where m is an integer) of the data storing the first sum obtained by adding the value multiplied by N are stored in one of the first D-FFs and applied to the N first adders as the first feedback data.

The VCO circuit 18 illustrated in FIG. 7 further includes N second adders that add m+1-bits or more of each output of the N first D-FFs to second feedback data, which is described below, and a second D-FF serving as a memory that stores every period P1 of the reference clock, among N second sums output from the second adders, the second sum of the second adder to which the m+1-bits or more of the data storing the first sum obtained by adding the value multiplied by N is applied. The outputs of the second adders are illustrated as phdat1 MSB (Most Significant Bit) through phdat4 MSB in FIG. 7. The second D-FF stores the phdat4 MSB. The data stored in the second D-FF is applied to the second adders as the second feedback data.

Further, in the VCO circuit 18 illustrated in FIG. 7, the outputs of the N first D-FFs and the outputs of the N second adders are arranged to be lower bits in successive order of the multiplier outputs multiplied by 1 through N, and a virtual serial output phdat that changes with the temporal resolution of the time T2 (the period P1 of the reference clock/N) is output with a clock edge when data of a bit higher than a m-th bit of the data output from the first D-FF is different from the next lower bit and when the output of the second adder takes a predetermined value. Whether or not data of a bit higher than a m-th bit of the data output from the first D-FF is different from the next lower bit is determined by first comparators illustrated in the upper center of FIG. 7. Whether or not the output of the second adder takes the predetermined value is determined by second comparators illustrated at the lower right of FIG. 7. Although the predetermined value is illustrated as zero in FIG. 7, the predetermined value can be one.

In FIG. 7, the outputs of the first comparators and the outputs of the second comparators are input to AND circuits, which output out_parack[0] through out_parack[3], respectively.

The PD 20 in the digital PLL 12 illustrated in FIG. 6 includes a unit that uses the outputs of the N second adders as the virtual serial output phdat with the temporal resolution of the time T2 (the period P1 of the reference clock/N), detects a phase difference between the virtual serial output phdat and a virtual serial input, which is the signal parack, as phase difference data pddat every period P1 of the reference clock, and outputs the phase difference data pddat.

Figure 8:
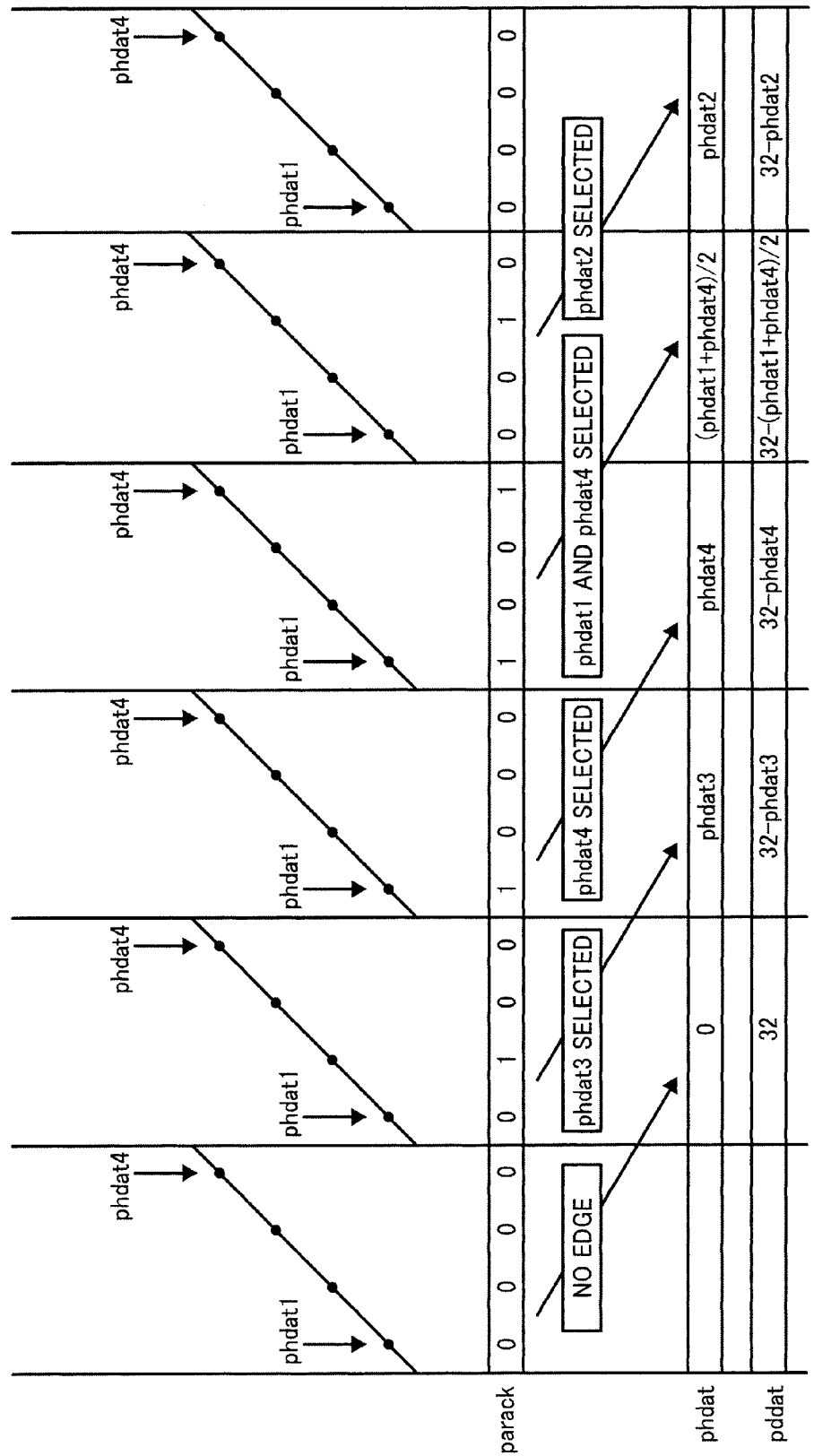
FIG. 8 is a diagram illustrating an example operation of a phase detector.

FIG. 8 is a diagram illustrating an example operation of the PD 20 in which the phase is detected by using the phase information of the signal phdat, which is the virtual serial output from the VCO circuit 18, and the virtual serial input parack.

The loop filter block in the digital PLL 12 illustrated in FIG. 6 includes a unit 22 that multiplies the detected phase difference data pddat by Ksys every period P1 of the reference clock, a unit 24 that multiplies the detected phase difference data by Kloop every period P1 of the reference clock, a unit 26 that adds up the phase difference data multiplied by Kloop every period P1 of the reference clock, and a unit 28 that adds the phase difference data multiplied by Ksys to an accumulated value of the phase difference data multiplied by Kloop every period P1 of the reference clock. This sum of the unit 28 is output as a loop filter output of the loop filter block.

Further, in the digital PLL 12 illustrated in FIG. 6, the loop filter output is applied to the VCO circuit 18 as the input data vcoin, thereby forming a PLL feedback loop. With the digital PLL 12, the CDR circuit 2 rearranges the virtual serial output from the VCO circuit 18 into N-bit parallel data for every period P1 of the reference clock.

Figure 9:
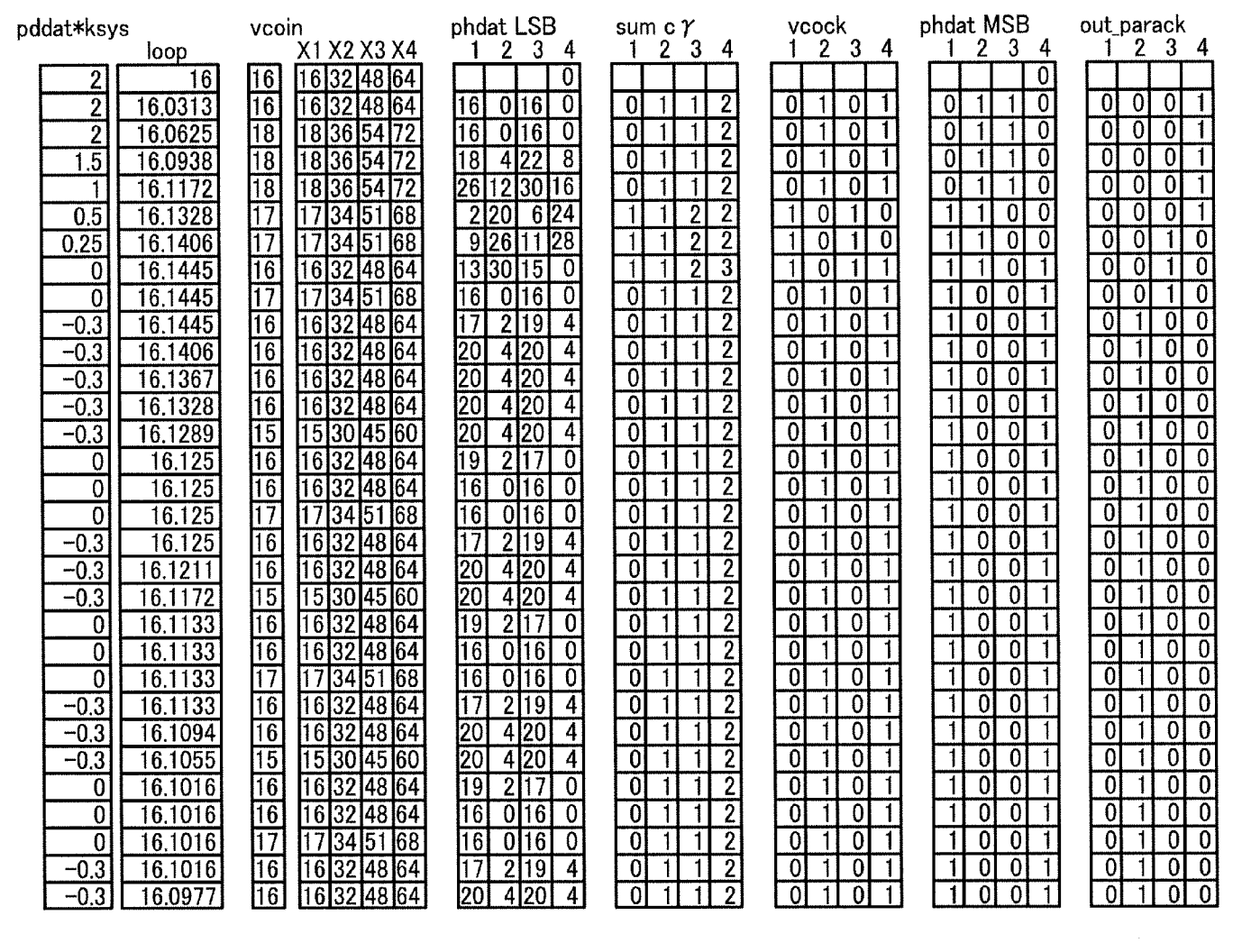

FIG. 9 is a diagram illustrating an example operation of the digital PLL 12 of FIGS. 6 through 8 with values for each signal. In this case, Ksys corresponding to the phase gain is 1/16 and Kloop corresponding to the integral gain is 1/64. One line in FIG. 9 corresponds to one clock period. As illustrated in FIG. 9, the phase of the virtual output out_parack is controlled to correspond to substantially the center position of the signal parack by quickly following the phase of the virtual serial input parack.

Figure 10:
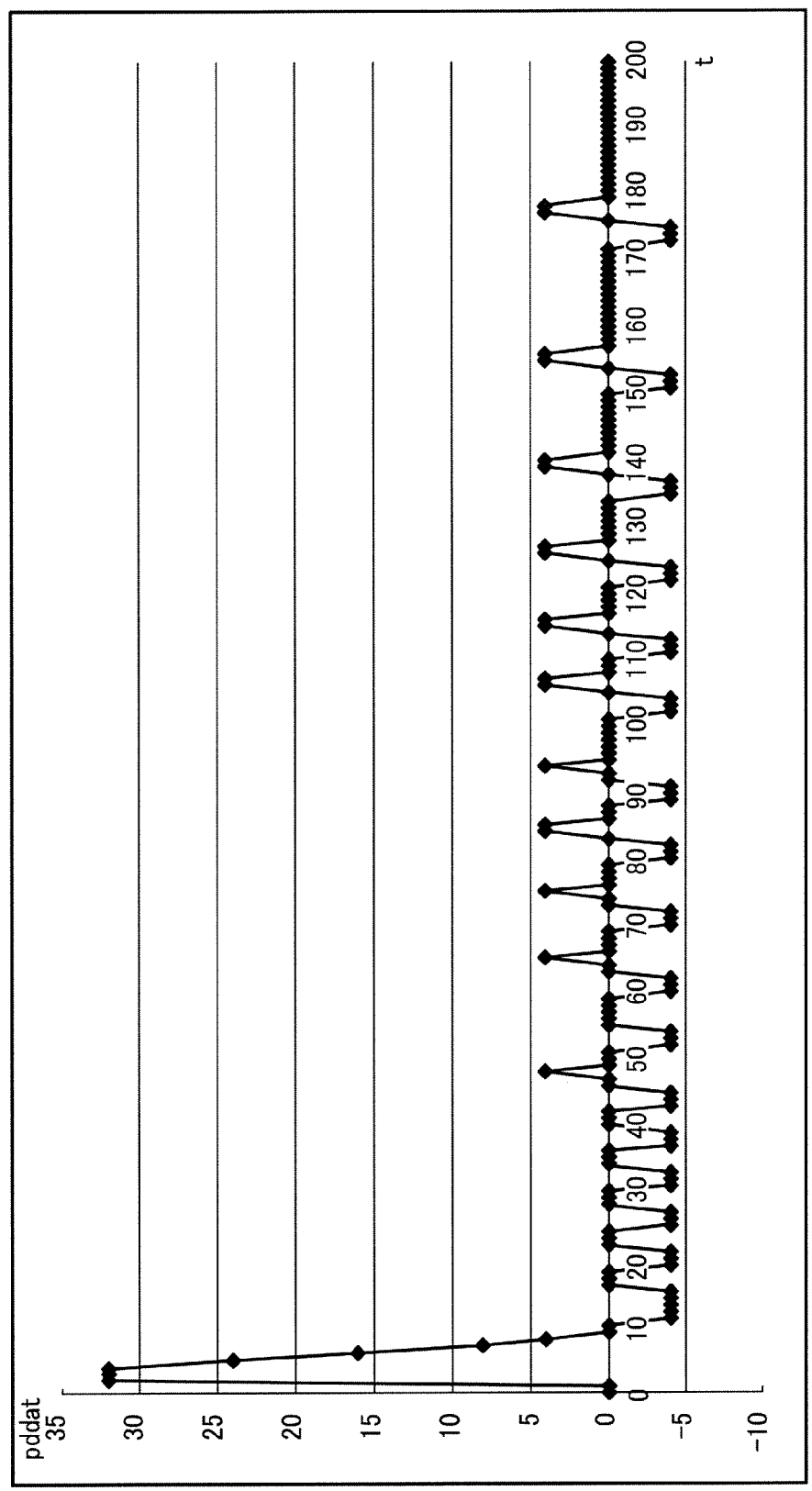
FIG. 10 is a graph in which the horizontal axis indicates time and the vertical axis indicates output of the phase detector.

To facilitate an understanding of the present disclosure, FIG. 10 represents a graph in which the horizontal axis indicates time and the vertical axis indicates the output pddat of the PD 20. As can be seen in FIG. 10, the values of the signal pddat do not converge to a constant value even after a sufficient amount of time (which is generally referred to as PLL hunting). This hunting phenomenon occurs due to rounding of the input data by the temporal resolution of the time T2 for four-phase clocks and limitations on a number of significant figures used in calculation. Although such hunting phenomenon can be reduced by increasing the number of multi-phase clocks and the number of significant figures used in calculation, such simple circuitry using four-phase clocks is sufficiently applicable since the output clock is used only to sample the input data (which is generally called punching) and therefore some hunting phenomenon causes no problem in clock and data recovery except when the input data is wrongly sampled (wrong punching).

Figure 11:
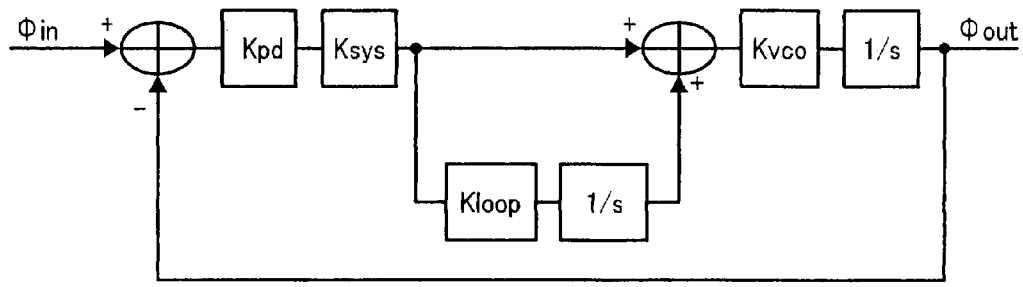
FIG. 11 is a block diagram illustrating an example transfer function representation of the digital PLL of FIGS. 6 through 10.

FIG. 11 is a block diagram illustrating an example transfer function representation of the digital PLL 12 of FIGS. 6 through 10. An open-loop transfer function G(s) of FIG. 11 is expressed by the following formula (1):

$$G(s)=Kpd \cdot Ksys(1+Kloop/s) \cdot Kvco \cdot 1/s \quad (1)$$

By expressing Kpd·Ksys·Kvco by K and Kloop by a, the formula (1) is simplified as follows:

$$G(s)=K/s(1+a/s) \quad (2)$$

A closed-loop transfer function H(s) is expressed by the following formula (3):

$$H(s)=\Phi out/\Phi in=G(s)/(1+G(s))=K(s+\alpha)/(s^2+K \cdot s+K \cdot a) \quad (3)$$

When $$K \cdot a = \omega_n^2, \quad (4)$$

$$H(s) = \frac{2 \cdot \xi \cdot \omega_n \cdot s + \omega_n^2}{s^2 + 2 \cdot \xi \cdot \omega_n \cdot s + \omega_n^2} \quad (5)$$

The formula (5) is a well-known general expression for a quadratic control system of a complete integral. $\xi$ is a damping rate of response (damping constant) and $\omega_n$ is a natural frequency.

When $$\omega_n = \sqrt{K \cdot a}, \quad (6)$$

$$\xi = \frac{K}{2 \cdot \omega_n} = \frac{K}{2 \cdot \sqrt{K \cdot a}} = \frac{1}{2}\sqrt{\frac{K}{a}} \quad (7)$$

Therefore, a stable feedback loop is configured by selecting appropriate values for K (=Kpd·Ksys·Kvco) and for a (=Kloop).

Figure 12:
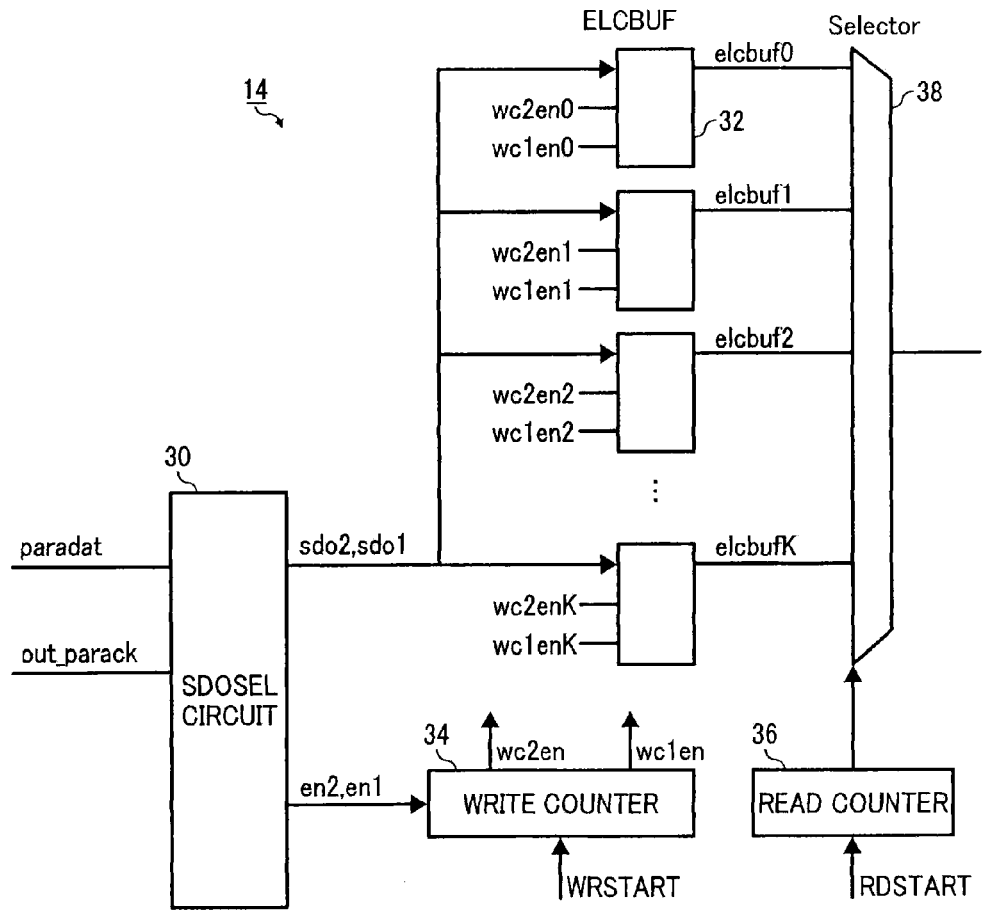
FIG. 12 is a diagram illustrating example circuitry of an elastic buffer according to the present invention.

FIG. 12 is a diagram illustrating example circuitry of the elastic buffer 14. The elastic buffer 14 includes an SDOSEL circuit 30, an ELCBUF block 32, a write counter block 34, a read counter block 36, and a selector 38. As illustrated in FIG. 12, the SDOSEL circuit outputs signals en1, en2, sdo1, and sdo2.

FIG. 13A is an example truth table of the SDOSEL circuit 30 of FIG. 12 when four-phase clocks are used and FIG. 13B is an example truth table of the SDOSEL circuit 30 of FIG. 12 when eight-phase clocks are used.

Figure 14A:
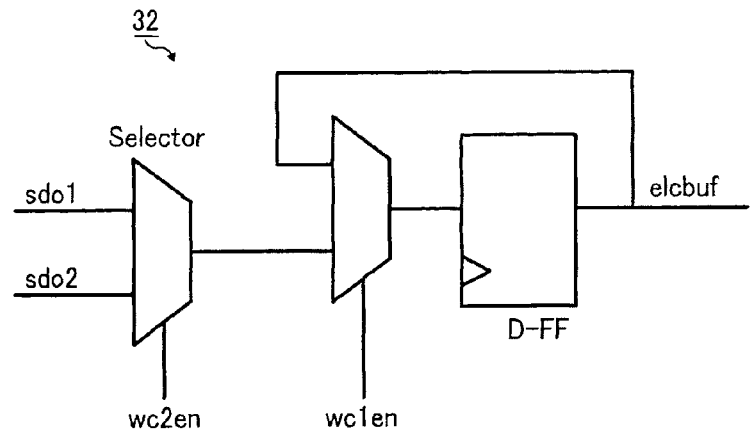
FIG. 14A is a diagram illustrating example circuitry of an ELCBUF block of FIG. 12.
Figure 14B:
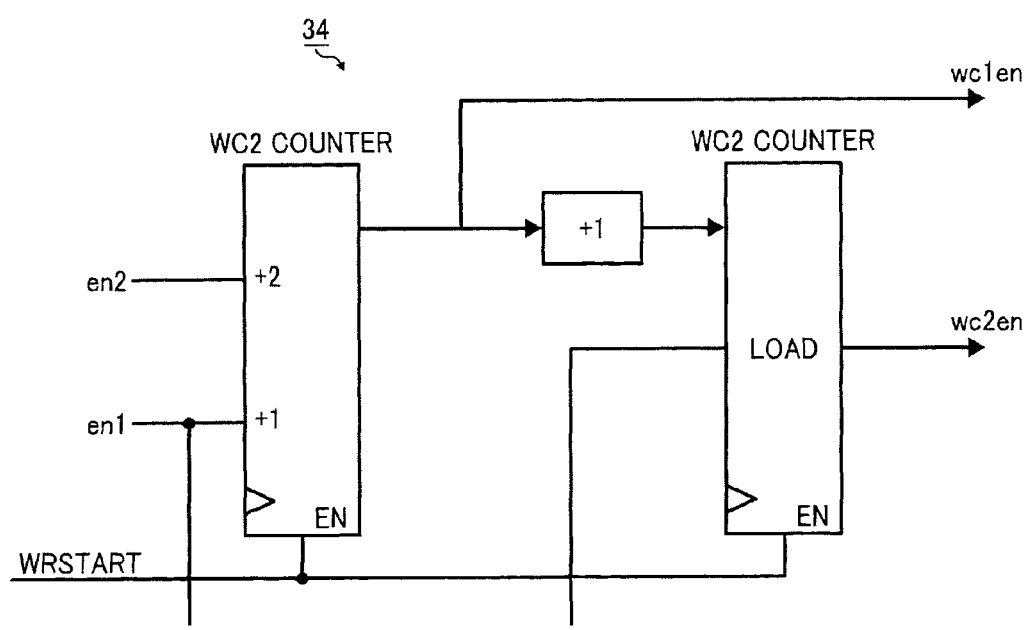
FIG. 14B is a diagram illustrating example circuitry of a write counter block of FIG. 12.

FIG. 14A is a diagram illustrating example circuitry of the ELCBUF block 32 of FIG. 12 including selectors and a D-FF and FIG. 14B is a diagram illustrating example circuitry of the write counter block 34 of FIG. 12 including WC2 counters, one of which serves as a load. The write counter block 34 outputs signals wc2en and wc1en, which are then input to the ELCBUF block 32. The signals input to the ELCBUF block 32 are illustrated in FIG. 12 as wc1en0 through wc1enK and wc2en0 through wc2enK.

The read counter block 36 illustrated in FIG. 12 is a simple counter circuit in which a counter is incremented every period P1 of the reference clock at the receiver and uses a signal RDSTART as an enable signal, although the detailed configuration thereof is not illustrated.

The selector 38 illustrated in FIG. 12 is a selector that selects one of elcbuf0 to elcbufK according to the value of the read counter block 36.

A signal WRSTART illustrated in FIG. 12 is a signal that is activated when data transfer begins, i.e., a signal that is activated in an unsquelch state. The signal RDSTART is a signal that is activated when the value of the write counter block 34 reaches half the full count after the write counter block 34 begins counting with the signal WRSTART.

The depth (size) of the elastic buffer 14 is determined to be below full or more than empty, even when a frequency difference between the reference clock at the transmitter and the reference clock at the receiver is at its maximum permitted by the interface standard (+−500 ppm for USB 2.0) for a period of time to transmit a maximum amount of data at one time permitted by the interface standard (which for USB is referred to as a packet length). That is, a depth of the elastic buffer 14 is equal to the full count of the write counter block 34. By starting the read counter block 36 when the write counter block 34 reaches half the full count, the depth of the elastic buffer 14 is not full or empty either when the frequency of the reference clock at the transmitter is greater than that of the reference clock at the receiver or when the frequency of the reference clock at the transmitter is smaller than that of the reference clock at the receiver.

As described above, the CDR circuit according to the first embodiment includes a circuit that samples data with multi-phase clocks and converts the sampling data into parallel data for every given cycle period. Therefore, it is easy to input multi-phase clocks with different delays together. In addition, since only the reference clock at the receiver is used as an operation clock to regenerate the received data, the synchronous design technique mostly used in digital LSI design is available, thus shortening a development time including design verification.

Although N is described above as an integer equal to or greater than 3, in view of the architecture of digital circuitry it is preferable that N be an n-th power of 2, such as 4, 8, 16, etc.

It is sufficient for a PLL used for clock and data recovery in a serial data interface to have a variation range (which is referred to as a lock range or a capture range of a PLL) so as to absorb a frequency difference between the reference clock at the transmitter and the reference clock at the receiver. For example, according to USB 2.0 standard, this range is from −500 ppm to +500 ppm and therefore the frequency difference is up to 0.1%. The variation range is sufficient even when the number of patterns of the N-bit parallel data for use in the present embodiment is limited to N+2. By this limitation, the circuitry of the digital PLL 12 and the elastic buffer 14 can be simplified.

Further, despite operating using the reference clock at the receiver, the digital PLL according to the present embodiment obtains a virtual output with the temporal resolution of the time T2 obtained by dividing the period P1 of the reference clock by N. In addition, the open-loop transfer function of the digital PLL according to the present embodiment is a general expression for a quadratic control system of a complete integral, and therefore the PLL characteristics can be freely controlled.

A CDR circuit according to a second embodiment is substantially similar to the CDR circuit according to the first embodiment. The digital PLL, which differs between the two, is described below.

In addition to the function of the digital PLL used in the CDR circuit according to the first embodiment, the digital PLL used in the CDR circuit according to the second embodiment free-runs at a frequency that is not very different from the reference clock at the receiver when there is no change in the received input data, and is quickly locked to the phase of the received input data when there is a change in the received input data.

Specifically, an initial value of the unit 26 that adds up the phase difference data multiplied by Kloop in the digital PLL 12 illustrated in FIG. 6 is set to a value at the period P1 of the virtual serial output.

In a PLL, when there is no change in received input data, a phase difference data output indicates no phase difference. Therefore, the output clock is determined only by a value obtained by adding up previous phase difference data (which is generally referred to as integral component as for a PLL), which is generally referred to as free-running with an integral component as for a PLL.

In the digital PLL in the CDR circuit according to the second embodiment, the initial value obtained by adding up previous phase difference data multiplied by Kloop corresponds to the period of the reference clock, and therefore the digital PLL free-runs at a frequency of the reference clock at the receiver when there is no change in the received input data.

A CDR circuit according to a third embodiment is substantially similar to the CDR circuit according to the first embodiment with the exception of the digital PLL, which differs between the two and is described below.

In addition to the function of the digital PLL used in the CDR circuit according to the first embodiment, the digital PLL used in the CDR circuit according to the third embodiment controls its output value so that the output value does not greatly deviate from the reference clock at the receiver when there is a sudden change in the input data due to, for example, noise.

Specifically, the digital PLL includes a limiter to set the output value of the unit 26 that adds up the phase difference data multiplied by Kloop to a value corresponding to several times the frequency difference between the reference clock at the transmitter and the reference clock at the receiver, both of which conform to the serial transfer standard used therefor.

Since a stable frequency standard is generally required for the reference clock for use in a serial interface both at the transmitter and at the receiver, there cannot be a sudden large change in the frequency of the clock extracted from the received data. In the digital PLL in the CDR circuit according to the third embodiment, the integral component is limited to a possible variation range that is several times the difference permitted by the standard to allow for a certain margin. Therefore, the output value does not greatly deviate from the reference clock at the receiver when there is a sudden change in the input data due to, for example, noise.

A CDR circuit according to a fourth embodiment is substantially similar to any one of the CDR circuits according to the first, second, and third embodiments. A serial data interface included in a communications apparatus according to the fourth embodiment conforms to USB 2.0 standard.

Specifically, any one of the CDR circuits according to the first, second, and third embodiments is available in a clock and data recovery system conforming to USB 2.0, which is a leading standard for a serial data interface.

A CDR circuit according to a fifth embodiment is substantially similar to the CDR circuit according to the first embodiment with the exception of the digital PLL, which differs between the two and is described below.

In addition to the function of the digital PLL used in the CDR circuit according to the first embodiment, the digital PLL used in the CDR circuit according to the fifth embodiment does not cause phase disturbance of the output clock at a change point from absence to presence of received data (transition to an unsquelch state) and at a change point from presence to absence of received data (transition to a squelch state).

Specifically, when there is no change in the received input serial data for six times reference clock cycle or more, the digital PLL causes the output of a unit to indicate no phase difference. This unit is the unit that uses the outputs of the N adders as a virtual serial output with the temporal resolution of the time T2 (the period P1 of the reference clock cycle/N) and detects the phase difference between the virtual serial output and the virtual serial input (which indicates a change point in the sampling data) as the phase difference data every clock period.

USB 2.0 is a standard for data transfer using a pair of small-amplitude differential signals. The transmission side and the receiving side are switched between each other according to the transfer data. No transfer data means that there is no signal (the squelch state). At a change point from absence to presence of received data (transition to an unsquelch state) and at a change point from presence to absence of received data (transition to a squelch state), outputs of a differential receiver and a squelch detection receiver are generally used as enable signals. However, since the response time of the differential receiver and the response time of the squelch detection receiver cannot be the same, the phase of the received data input to the PLL is disturbed at a transition point to an unsquelch state or at a transition point to a squelch state.

At these transition points, the digital PLL in the CDR circuit according to the fifth embodiment causes the output of the unit detecting the phase difference as the phase difference data to indicate no phase difference. Therefore, the phase of the output clock is not disturbed.

USB 2.0 standard defines a pattern indicating the end of transfer data (packet) as a data pattern without a change for seven clock cycles or more. Therefore, according to the present embodiment, in view of the frequency difference between the transmission side and the receiving side, the detected phase difference data is masked (i.e., indicates no phase difference) when there is no change in the received input serial data for six times the reference clock cycle or more.

As can be understood by those skilled in the art, numerous additional modifications and variations are possible in light of the above teachings. It is therefore to be understood that, within the scope of the appended claims, the disclosure of this patent specification may be practiced otherwise than as specifically described herein.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program or computer program product. For example, the aforementioned methods may be embodied in the form of a system or device, including, but not limited to, any of the structures for performing the methodology illustrated in the drawings.

Example embodiments being thus described, it will be apparent that the same may be varied in many ways. Such variations are not to be regarded as a departure from the spirit and scope of the present invention, and all such modifications as would be obvious to one skilled in the art are intended to be included within the scope of the following claims.

What is claimed is:

1. A clock and data recovery circuit comprising:
a clock output unit configured to output N-phase clocks each of which has a phase shifted from the others by a time T2 obtained by dividing a period P1 of a reference clock at a receiver at a given frequency by N, where N is an integer equal to or greater than 3;
a sampling unit configured to obtain sampling data serially transferred at every time T2;
a first conversion unit configured to convert the sampling data into first N-bit parallel data every period P1;
a second conversion unit configured to convert the first N-bit parallel data into second N-bit parallel data indicating a change point in the sampling data; and
a data output unit configured to use the second N-bit parallel data as input of phase information and output third N-bit parallel data indicating substantially a center position of the change point in the sampling data,
wherein data of the first N-bit parallel data at a position equal to substantially the center position indicated by the third N-bit parallel data is determined to be recovered data.

2. The clock and data recovery circuit according to claim 1, wherein the second conversion unit limits a number of patterns of the second N-bit parallel data to N+2 and the data output unit outputs only N+2 patterns of the third N-bit parallel data.

3. The clock and data recovery circuit according to claim 1, wherein the data output unit comprises a digital PLL configured to use the second N-bit parallel data as a virtual serial input including phase information with a temporal resolution of the time T2, and to output a virtual serial output changing with the temporal resolution of the time T2,
the digital PLL comprising:
a phase comparator;
a loop filter block configured to control PLL feedback; and
a VCO circuit being equivalent to an oscillator, the VCO circuit comprising:
N multipliers configured to multiply input data to the VCO circuit by 1 through N, respectively;
N first adders configured to add N outputs of the multipliers to first feedback data;
N first memories configured to store N first sums output from the first adders every period P1, one of the first memory configured to apply lower m bits (m is an integer) of data storing the first sum obtained by adding the value multiplied by N to the N first adders as the first feedback data;
N second adders configured to add m+1 bits or more of each output of the N first memories to second feedback data; and
a second memory configured to store every period P1, among N second sums output from the second adders, the second sum of the second adder to which the m+1 bits or more of the data storing the first sum obtained by adding the value multiplied by N is applied and apply the stored second sum to the N second adders as the second feedback data,
wherein the virtual serial output changing with the temporal resolution of the time T2 is output with a clock edge, when data of a bit higher than a m-th bit of the output of the first memory is different from data of a next lower bit, and when the output of the second adder takes a predetermined value, under a condition in which the outputs of the N first memories and outputs of the N second adders are arranged to be lower bits in successive order of the multiplier outputs multiplied by 1 through N.

4. The clock and data recovery circuit according to claim 3,
wherein the phase comparator comprises a detection unit configured to use the outputs of the N second adders as the virtual serial output with the temporal resolution of the time T2, detect a phase difference between the virtual serial output and the virtual serial input as phase difference data every period P1, and output the phase difference data, and
wherein the loop filter block comprises:
a first multiplier configured to multiply the detected phase difference data by Ksys every period P1;
a second multiplier configured to multiply the detected phase difference data by Kloop every period P1;
an accumulator configured to add up the phase difference data multiplied by Kloop every period P1; and
an adder configured to add the phase difference data multiplied by Ksys to an accumulated value of the phase difference data multiplied by Kloop every period P1 and output a sum as a loop filter output,
wherein the loop filter output is applied to the VCO circuit as the input data to form a PLL feedback loop, and the virtual serial output from the VCO circuit is rearranged into N-bit parallel data for every period P1 to serve as the third N-bit parallel data.

5. The clock and data recovery circuit according to claim 4, wherein an initial value of the accumulator is set to a value at the period P1 of the virtual serial output.

6. The clock and data recovery circuit according to claim 4, wherein the digital PLL further comprises a limiter configured to set the output value of the accumulator to an output value of the virtual serial output corresponding to several times a frequency difference between a reference clock at a transmitter and the reference clock at the receiver conforming to a serial transfer standard used therefor.

7. The clock and data recovery circuit according to claim 3, wherein, when there is no change in the received input serial data for six times the period P1 or more, the digital PLL causes an output of a detection unit to indicate no phase difference, and wherein the detection unit is configured to use the outputs of the N second adders as the virtual serial output with the temporal resolution of the time T2 and detect a phase difference between the virtual serial output and the virtual serial input as the phase difference data every period P1.

8. The clock and data recovery circuit according to claim 1, wherein the clock and data recovery circuit is incorporated in a communications apparatus.

9. The clock and data recovery circuit according to claim 8, wherein the clock and data recovery circuit is used in a serial data interface conforming to a USB 2.0 standard.

10. A communications apparatus comprising a clock and data recovery circuit,
the clock and data recovery circuit comprising:
a clock output unit configured to output N-phase clocks each of which has a phase shifted from the others by a time T2 obtained by dividing a period P1 of a reference clock at a receiver at a given frequency by N, where N is an integer equal to or greater than 3;

a sampling unit configured to obtain sampling data serially transferred at every time T2;

a first conversion unit configured to convert the sampling data into first N-bit parallel data every period P1;

a second conversion unit configured to convert the first N-bit parallel data into second N-bit parallel data indicating a change point in the sampling data; and a data output unit configured to use the second N-bit parallel data as input of phase information and output third N-bit parallel data indicating substantially a center position of the change point in the sampling data, wherein data of the first N-bit parallel data at a position equal to substantially the center position indicated by the third N-bit parallel data is determined to be recovered data.

11. The communications apparatus according to claim 10, wherein the clock and data recover circuit is used in a serial data interface conforming to a USB 2.0 standard.

* * * * *